United States Patent [19]
Ikegaya et al.

[11] Patent Number: 5,587,013
[45] Date of Patent: Dec. 24, 1996

[54] METHODS OF SYNTHESIZING AND POLISHING A FLAT DIAMOND FILM AND FREE-STANDING DIAMOND FILM

[75] Inventors: Akihiko Ikegaya; Keiichiro Tanabe; Naoji Fujimori, all of Hyogo, Japan

[73] Assignee: Sumitomo Electric Industries, Ltd., Osaka, Japan

[21] Appl. No.: 379,692

[22] Filed: Jan. 27, 1995

[30] Foreign Application Priority Data

Jan. 27, 1994 [JP] Japan .................................. 6-26353

[51] Int. Cl.$^6$ .................................................. C30B 29/04
[52] U.S. Cl. ............................ 117/89; 117/104; 117/105; 117/929
[58] Field of Search ............................ 117/929, 89, 104, 117/105; 264/81

[56] References Cited

U.S. PATENT DOCUMENTS

| | | | |
|---|---|---|---|
| 4,987,002 | 1/1991 | Sakamoto et al. | 264/81 |
| 5,225,366 | 7/1993 | Yoder | 117/929 |
| 5,241,140 | 8/1993 | Itoh et al. | 428/260 |
| 5,273,731 | 12/1993 | Anthony et al. | 117/99 |
| 5,314,726 | 5/1994 | Kurihara et al. | 427/122 |

FOREIGN PATENT DOCUMENTS

| | | |
|---|---|---|
| 0470644 | 2/1992 | European Pat. Off. . |
| 0551730 | 7/1993 | European Pat. Off. . |
| 4-92890 | 3/1992 | Japan ........................ 423/446 |

OTHER PUBLICATIONS

Guo et al, "Strain in CVD Diamond Films: Effects of Deposition Variables", Thin Solid Films, Applied Diamond Conference, vol. 212, No. 1–2, ISSN 0040–6090 pp. 173–179.

Windischmann et al., "Free–Standing Diamond Membranes: Optical, Morphological and Mechanical Properties", Diamond and Related Materials, vol. 1, No. 5/6, Apr. 15, 1992, pp. 656–664.

*Primary Examiner*—Robert Kunemund
*Attorney, Agent, or Firm*—Cushman Darby & Cushman, IP Group of Pillsbury Madison & Sutro LLP

[57] ABSTRACT

A flat free-standing diamond film is produced by growing alternately at least one pair of a potential-concave diamond layer and a potential-convex diamond layer on a non-diamond substrate and eliminating the substrate. The potential-concave films are made by a CVD method under a condition (b), which is characterized by of a substrate temperature of 880° C. to 950° C. and a hydrocarbon ratio of 2.5 vol % to 3.5 vol %. The potential-convex films are made by a CVD method under the condition (a) which is charcterized by of a substrate temperature of 800° C. to 850° C. and a hydrocarbon ratio of 0.5 vol % to 1.5 vol %. The condition (a) can make a potential-convex film of a good crystal quality in spite of a slow deposition speed. It is preferable to employ an assembly of thinner potential-convex films and thicker potential-concave films to curtail the total time of synthesis. A multilayered diamond film with an arbitrary curvature can be produced by selecting the production conditions (a) and (b), and the thicknesses of the potential-convex layers and the potential-concave layers.

The diamond films still fixed on the substrate can be polished by an ordinary polishing apparatus, since the film is flat. A polished flat diamond film can be obtained by eliminating the substrate.

32 Claims, 4 Drawing Sheets

METHODS OF SYNTHESIZING AND POLISHING A FLAT DIAMOND FILM AND FREE-STANDING DIAMOND FILM

FIELD OF THE INVENTION

This invention relates to a method of synthesizing a free-standing diamond film, a flat diamond film itself and a method of polishing a diamond film. Diamond films have a wide scope of applications, for example, heat sinks of semiconductor devices, diamond substrates for electronic devices, optical parts for optical devices, abrasion-resistance tools or parts of cutlery. In many cases, diamond thin films coat substrates for reinforcing the mechanical strength of the substrates. The substrates support the diamond thin film. However these diamond films are inseparable from the substrates. This invention aims to making a free-standing diamond film, which consists only of diamond and can maintain its shape without the support of a substrate.

BACKGROUND OF THE INVENTION

This invention claims the priority of Japanese Patent Application No. 26353/1994 filed on Jan. 27, 1994, which is incorporated herein by reference. ① EPO 551 730 A1 proposes a method of producing a flat CVD diamond film. A diamond film can be synthesized on a suitable non-diamond substrate by the chemical vapor deposition (CVD) method. However, the diamond film suffers a tensile stress which is caused by growth defects or "intrinsic strain". The intrinsic strain increases in proportion to the thickness of the diamond film. When a diamond film has been deposited on a non-diamond substrate and the substrate is eliminated by some solvent, the diamond film bends or breaks due to the release of the stress. The prior art suggestes a method of making a flat self-supporting diamond film while preventing deformation. The method includes the steps of preparing a convex substrate having a predetermined curvature for offsetting any bending due to the expected tensile stress, synthesizing a diamond film by a CVD method on the convex substrate and removing the convex substrate. The resulting diamond film is a free-standing film (or self-supporting film). Since the diamond film is grown on the convex substrate, the diamond film shares the convex shape of the substrate. When the film is separated from the substrate, the stress is released in the self-supporting film. The inner stress causes the top surface to shrink and the bottom surface to elongate. Since the diamond film had originally been convex, the film deforms in the direction for decreasing the bend. The release of the inner stress transforms the originally-convex film into a flat one, if the deformation caused by the inner stress exactly equals the original convex bend. Then the prior art fixes the flat, self-supporting film on a polishing plate, polishes the film in a polishing machine and provides a flat, smooth self-supporting film.

PROBLEMS TO BE SOLVED

Wafers of diamond must be produced in order to expand the practical utility and applications of diamond, such as silicon wafers in the silicon semiconductor industries. A silicon wafer enables the device makers to fabricate numerous devices on the wafer at the same time by wafer processes. Until now, no wafer of diamond has been made due to the difficulty of making a large crystal of diamond. There is no diamond wafer at present which contains nothing other than diamond. Furthermore, the silicon wafers must be extremely flat to be suitable for wafer processes such as photolithography which optically transcribes a mask pattern on the resist coated on the silicon wafer. If diamond wafers could be produced, the flatness would be also extremely important because for the diamond wafers (similar to silicon wafers) also would be treated by some wafer processes.

Unlike silicon, diamond wafers cannot be produced by growing a bulk single crystal ingot by a Czochralski method and slicing the ingot into a plurality of thin wafers by an inner blade slicer. On the other hand, a diamond-coated wafer can be produced by growing a diamond film on a wide non-diamond substrate by a CVD method. However, in this case, the diamond-coated wafer is not a pure diamond wafer, but a complex wafer consisting of the diamond film and the non-diamond substrate. The diamond is not a self-supporting film.

A pure, self-supporting diamond film could be made by growing a comparatively thick diamond film on a non-diamond substrate and eliminating the substrate by some solvent. However, such a diamond film deforms due to the release of internal stress when the substrate is eliminated. As a result such a diamond cannot be processed by the wafer process due to the bending. If a diamond film which has been grown on a flat substrate is separated from the substrate, the free-standing film will become concave due to the tensile stress originated form the difference of the thermal expansion between the diamond and the substrate metal.

As mentioned before, the prior art had prepared a convex substrate for producing a convex diamond film on it. The substrate was made by cutting a hard metal plate, for example, a molybdenum (Mo) plate in the prior art. Mo is too hard to cut into an arbitrary shape because of its hardness and fragility. Thus, it is difficult to make a slightly-convex Mo substrate which has a spherical surface with a quite small height of 50 μm to 260 μm in a diameter of 1 inch (25 mm) by mechanical cutting. The difficulty of making a convex substrate raises the cost of production. The provision of diamond devices requires more inexpensive manufacturing technique.

The other difficulty of the prior art is the rigor of the condition which enables the inner stresses to cancel the primary deformation of the separated diamond film. The fundamental idea of the prior art is that the curvature of the convex substrate should cancel the tendency for bending the film into a concave shape due to the tensile stress induced by the vapor phase synthesis. The curvature of the Mo substrate cannot be changed, because it is shaped by mechanical cutting. However, the tensile stress in the diamond film varies with the condition of synthesis or the thickness of the film. The thicker the film becomes, the stronger the tensile stress grows.

If some condition is selected for diamond synthesis, the tensile stress should be uniquely determined by the thickness of the film. The thickness is the single parameter for defining the inner stress. Only a single particular thickness can provide a diamond film which achieves a desired flatness of the film, when the film is separated from the convex substrate. "Ts" designates such an optimum thickness. If the actual thickness exceeded Ts, the tensile stress would become too big and the separated film would bend into a concave one. To the contrary, if the actual thickness were smaller than Ts, the tensile stress would be insufficient and the film would bow into a convex one. The thickness is a variable which can be arbitrarily changed even during the film growth. Nevertheless, the curvature of the substrate cannot be varied. Namely, the prior art has another drawback of the low freedom of determining the final shape of the isolated film. The poor controllability makes it difficult to make a flat film.

Furthermore, the prior art had to polish the self-supporting film, if a mirror wafer were demanded. The prior art does not mention the polishing of the wafer. Perhaps the diamond wafer could be processed by the steps of gluing the free-standing diamond film to a polishing plate with an adhesive, setting the polishing plate to a rotary pressing head, bringing the wafer into contact with the rotary polishing table, supplying a polishing liquid to the table, rotating the pressing head and revolving the polishing table. However, such a method would demand too many steps, since the polishing would have to start from the isolated film. If possible, it would be more convenient to polish the film still fixed on the substrate than to polish the once-isolated film. But the diamond film fixed on the substrate could not be polished by a conventional polishing machine, because the substrate and the film are not flat but convex. One purpose of the present invention is to provide a method of synthesizing a diamond free-standing film which is rich with controllable parameters. Another purpose is to provide a method of synthesizing a diamond free-standing film which excels in the controllability. A further purpose of the invention is to provide a method for making a diamond film by growing a diamond film on a flat substrate which can be easily shaped. Another purpose is to provide a diamond free-standing film which excels in flatness. A further purpose of the present invention is to provide a polishing method which is capable of polishing the diamond film still fixed on the substrate.

SUMMARY OF THE INVENTION

The method of the present invention synthesizes a diamond free-standing film by the steps of preparing a flat non-diamond substrate, growing alternately more than one diamond layer under conditions which make a convex diamond layer and more than one diamond layer, under other conditions which make a concave diamond layer. If a mirror wafer is required, the diamond film should be polished in the state In which the diamond film coats the substrate. Since the substrate is flat, the diamond can be polished by a conventional polishing machine.

Namely, the first discovery on which this invention is founded is that the convex diamond film as well as the concave diamond film can be produced by controlling the conditions of growth. Like the prior art, it was discovered that tensile stress occurs in a the diamond film grown on a metal substrate and the isolated film bends into a concave shape due to the tensile force. Actually the prior art wrote that the tensile stress was originated from the higher thermal expansion coefficient of a substrate and the lower thermal expansion coefficient of a diamond film and that the film surely bowed into a concave shape, if the film had been deposited on a flat substrate. But this is wrong. An intensive investigation has taught the Inventors the probability of occurrence of the compressive stress and the probability of making convex films. The Inventors have discovered that the condition of growth determines whether a tensile stress or a compressive stress prevails in the film. Therefore, the direction of deformation of an isolated film is governed by the condition of growth. The diamond film is not necessarily bent into a concave shape, but sometimes is bent into a convex shape under a special condition of growth. Thus a convex film with a compressive stress can positively be fabricated by controlling the condition of growth.

The newly-discovered fact supports the present invention. The fact enabled the Inventors to contrive this invention. The idea of the present invention is to combine the films which will bend concave and the other films which will bend convex, to equalize the concave-bending force and the convex-bending force in the multilayers and to make flat diamond multilayers.

Some concepts are now defined to clarify the following explanation. A top surface of a film Is the surface which has been a free surface during the film formation. A bottom surface is the surface which has been in contact with the substrate. "Convex" or "concave" is defined to the top surface. If a convex film is turned upside down, the film seems concave. But the film is still called a convex film. A convex film has a higher center than a peripheral part. A concave film has a lower center than a peripheral part. When a film covers a substrate, the curvature of the film is equal to the curvature of the substrate. When the film is separated from the substrate, the film bends either into convexity or into concavity. The film which will be deformed into convexity when it is separated from the substrate is shortly called a "potential-convex" film. The film which will be deformed into concavity when it is separated from the substrate is called a "potential-concave" film. The condition (a) which endows a film with a tendency of bending convexly is called a "convex-distortion" condition. The condition (b)which makes a potential-concave film is called a "concave-distortion" condition.

The tendencies are latent, when the films are still joined to the substrate. The properties are revealed first by isolating the film from the substrate. The elimination of the substrate is the condition of revealing the potential tendencies which have been latent In the film adhering to the substrate. The prior art believed only the concave film could be produced by such a method using a temporal substrate, because any metal substrate has larger thermal expansion than diamond and the cooling after the growth of the film generates tensile stress. However, the Inventors have discovered the possibility of the convex deformation of the separated diamond film for the first time. Some condition enables the CVD-grown diamond film to bend convexly when it is separated from the flat substrate.

Clarification of the present invention requires two more parameters. One is a tendency or a potential for bending. The other is the thickness of diamond films. The tendency or potential is called "concave-bending potential U per unit thickness", if the film will be deformed in a concave shape, when the substrate is eliminated. Otherwise, the tendency is called "convex-bending potential Q per unit thickness", if the film will be deformed in a convex form, when it is separated from the substrate. The parameters U and Q may be signified by the curvatures $\xi$, the curving radius R or the height H in a definite wafer radius D or so. These candidates satisfy the relations, i.e., $\xi=1/R$, $H=D^2/8R$, $R=D^2/8H$ and $\xi=8H/D^2$. FIG. 9 and FIG. 10 show the definitions and the relations of the parameters.

If the diameters D of wafers are constant, the height H is proportional to the curvature $\xi$. Thus, the potentials U and Q would correspond to $\xi$, H or 1/R. However, U and Q are not exactly equal to $\xi$, H or 1/R. U or Q should be deemed to be an abstract potential which causes the bend.

The thicknesses of convex films are denoted by $T_1, T_2, T_3$, .... T is the sum of $T_1, T_2, T_3, \ldots$. The thicknesses of concave films are designated by $S_1, S_2, S_3, \ldots$. The sum of $S_1, S_2, \ldots$ is denoted by S.

This invention deposits more than one convex film and more than one concave film alternately on a flat substrate under the equilibrium condition that the free-standing multilayered film becomes flat due to the balance between the potential bending concavely and the potential bending convexly, when the substrate is eliminated. The bending power of an individual film is the product of the thickness and the bending potential U or Q. The bending power for deforming the firm into a convex shape is denoted by the sum of the products of the thickness and the bending potential. Namely, the balance of the bending powers is symbolically represented by $$\Sigma U_j S_j = \Sigma Q_k T_k \quad (1)$$

where j is the number of a potential-concave film, $S_j$ is the thickness of the j-th is the potential-concave film, $U_j$ is the concave-bending potential of the same film, k is the number of a potential-convex film, $T_k$ is the thickness of the k-th potential-convex film, $Q_k$ is the convex-bending potential of the same film.

If the suffixes are omitted for the sake of simplicity, the condition can briefly be expressed by $\Sigma US = \Sigma QT$. This is an abstract expression of the equilibrium condition which gives final flatness to the diamond film. This invention produces a flat diamond film, making the best of the balance of potentials.

The bending potentials per unit thickness are not the quotient of the bending divided by the thickness. The bending potential U or Q per unit thickness rather corresponds to inner stress which causes the deformation. However, the inner stress in a diamond film which is still fixed on a substrate cannot be estimated exactly. The potentials U and Q which are abstract variables are useful to design a multilayered, flat diamond film from fundamental data.

(a) Convex-Distortion Condition (condition for making films convex when the substrate is removed)

The convex-distortion condition (a) is represented by the following parameters in the case of the filament CVD method.

Substrate temperature: 800° C.–850° C.

Pressure of synthesis: 50 Torr–150 Torr (6670 Pa–20000 Pa)

Temperature of filament: more than 2100° C.

Distance between filament and substrate: 5 mm–10 mm

Volume ratio of methane/(methane+hydrogen): 0.5%–1%

(b) Concave-Distortion Condition (condition for making films concave when the substrate is removed)

The concave-distortion condition (b) is represented by the following parameters in the case of the filament CVD method.

Substrate temperature: 880° C.–950° C.

Pressure of synthesis: 50 Torr–150 Torr (6670 Pa–20000 Pa)

Temperature of filament: more than 2100° C.

Distance between filament and substrate: 5 mm–10 mm

Volume ratio of methane/(methane+hydrogen): 2.5%–3.5%

Some asymmetry accompanies these conditions. The concave-distortion condition (b) belongs to the well-known synthesis condition of the CVD-grown diamond. In many cases diamond films have been produced under the condition like (b). The newly-introduced convex-distortion condition (a) demands a lower substrate temperature and a lower methane concentration than (b). Other hydrocarbon gases can be employed to make diamond films by the CVD method besides methane. If a hydrocarbon gas other than methane is employed, the concentration of the hydrocarbon is also lower in (a) than in (b).

In addition to the lower concentration of hydrocarbon, the condition (a) is also characterized by the lower substrate temperature (800° C. to 850° C.). The pressure, the filament temperature and the distance between the filament and the substrate are common to both (a) and (b).

The convex-distortion condition (a) is a novel condition of growing diamond films. Nobody has been aware of such a condition (a). The condition (a) enables the CVD method to produce convex-bending diamond films. The convex-distortion condition (a) defines a lower substrate temperature and a lower hydrocarbon (methane) concentration, which decrease the speed of synthesis of diamond. The condition (a) has a drawback of the slow growth. However, the time of synthesis can be alleviated by determining the total thickness T of the potential-convex films to be smaller than the total thickness S of the potential-concave films (T<S). In this case, the concave-bending potential U per unit thickness must be greater than the convex-bending potential Q per unit thickness. Of course, if a long synthesis time is not a concern, S<T is also allowable. In any case, a flat diamond film can be produced by the balance between the concave-deformation potential $\Sigma$ SU and the convex-deformation potential $\Sigma$ TQ.

The advantages of the present invention are explained. First of all, the present invention has discovered the probability of making a convex-deforming diamond film on a non-diamond substrate, which had been deemed to be quite impossible, since the thermal expansion coefficient of diamond was smaller than any probable substrates, Mo, Si, Ni, Cu and the like, and the separation of substrate gave the diamond film a tensile stress which bends the film into a concave shape. Potential-convex diamond films can be synthesized by the condition (a) which requires a lower hydrocarbon ratio and a lower substrate temperature than the ordinary synthesis condition (b). Fortunately, the films made by the condition (a) have excellent crystal properties without amorphous carbon.

The present invention succeeded in producing a flat, free-standing diamond film by growing potential-convex layers and potential-concave layers in turn on a substrate for balancing the inherent convex-deforming potential with the inherent concave-deforming potential and eliminating the substrate. The excellent flatness makes the free-standing diamond films suitable for substrates of semiconductor devices, diamond heat sinks and various materials for electronics. When the diamond films are employed as diamond wafers on which semiconductor devices are fabricated, the flatness of the wafer enables the manufacturers to adopt photolithography which requires extreme flatness of wafers. Furthermore, this invention provides flat free-standing diamond films preferable to optical parts, abrasive devices and cutting tools.

The potential-convex layers which excel in crystal quality have a drawback of the slow speed of growth. The potential-concave layers are superior in the speed of growth. Therefore, the total time of synthesis can be curtailed by enhancing the convex-bending potential Q, reducing the thickness T of potential-convex layers, decreasing the concave-bending potential U and increasing the total thickness S of potential-concave layers. The first coat (the bottom layer)

which is directly deposited on the substrate can be either a convex-potential layer or a concave-potential layer. However, the convex-potential film is more suitable for the first coat than the concave-potential film, because the convex-potential film can make a good interface between the substrate and the diamond first coat. The adoption of a convex-potential layer as a first coat has another advantage of giving the diamond film a higher heat conductitivity.

Irrespective of the shape of the substrate, the diamond film which is produced by this invention can maintain the intrinsic shape due to the cancellation of the convex-distortion potential $\Sigma$ TQ and the concave-distortion potential $\Sigma$ SU of the multilayered structure, when the film is isolated from the substrate. This fact enables the use of a flat plate as the substrate of the diamond CVD synthesis. The flat substrate is easier to make and more inexpensive than a convex substrate which had been recommended by ① (EP-0 551 730A1). The use of a flat substrate curtails the cost of production.

Another advantage of the use of a flat substrate is the possibility of polishing the film on the substrate. The convex film deposited on the convex substrate of the prior art cannot be polished by a rotary polishing machine in the state still fixed to the substrate. Since the present invention can use a flat substrate, the diamond film still on the substrate can be polished under a strong pressure by an ordinary rotary polishing machine. After the surface of the diamond film has been polished, a flat, mirror-polished free-standing diamond film is obtained by dissolving the substrate. The polishing before the elimination of the substrate enables to simplify the polishing process. The tight binding of the film to the substrate enables to apply considerably a high pressure to the film, which enhances the quality of polishing. The applicability of the high pressure is important to polish a diamond plate, because diamond which is the hardest material must be polished by applying strong pressure with diamond whetstones which have the same hardness.

DETAILED DESCRIPTION OF THE PREFERRED EMBODIMENTS

The dependence of the bending of films upon growth conditions was investigated by growing diamond films on substrates under various conditions by a filament CVD method. The filament CVD method is one of the CVD methods which grows a diamond film by heating the substrate by the radiation of a filament, supplying hydrogen gas and hydrocarbon gases to the heated substrate, inducing a vapor phase reaction for dissolving the gas in the heated gas under a reduced pressure and depositing the diamond film on the substrate.

Tungsten wires of a 0.3 mm diameter were adopted as the heater. Twelve tungsten wires were arranged in parallel at a 6 mm spacing in the horizontal direction above the substrate. The distance between the filaments and the substrate was 7 mm. Substrates were square silicon prates of 25 mm×25 mm×3 mm. The silicon plates had been prepared by mirror-polishing a surface on which a film will be deposited, and scratching the same surface with diamond polishing powder of an average diameter between 0.5μm and 3μm.

The silicon substrate was placed upon a susceptor in a reaction chamber (vacuum chamber). The reaction chamber was closed, sealed airtightly and vacuumed to 70 Torr(9330Pa). Then a material gas was supplied into the reaction chamber. The total pressure in the chamber was maintained at 70 Torr (9330Pa) by adjusting the power of the vacuum pump and the supply of the material gas. The material gas was a mixture of hydrogen gas and methane gas. The volume ratio of methane gas to the total gas ($H_2+CH_4$) was 0.5%, 1.0%, 2.0% or 3.5%.

The substrate could be heated by the filament heater and could be cooled by a cooling device. Thus, the heater and the cooling device adjusted the temperature of the substrate exactly. The temperature of the surface of the substrate was adjusted at 800° C., 860° C. or 920° C.

Diamond films were grown on the substrates under various conditions which changed the methane concentration and the substrate temperature as parameters. The thickness of the films was controlled by changing the time of synthesis.

Figure 9:
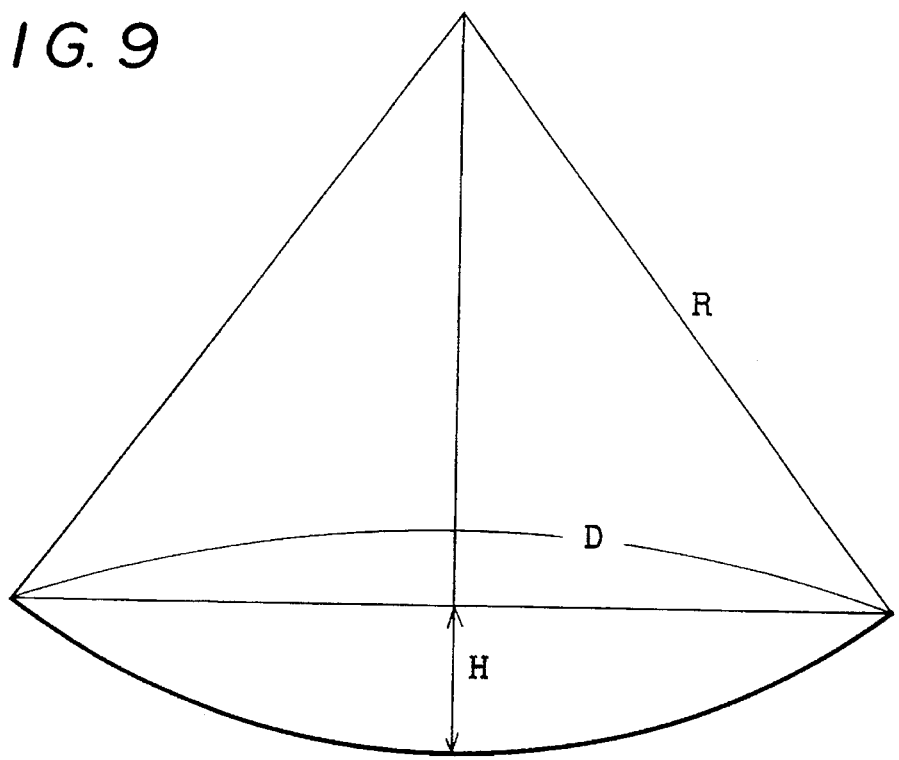
FIG. 9 is an explanatory figure defining the curvature $\xi$, the radius R of curvature and the height H (positive) of bending on a concave film.
Figure 10:
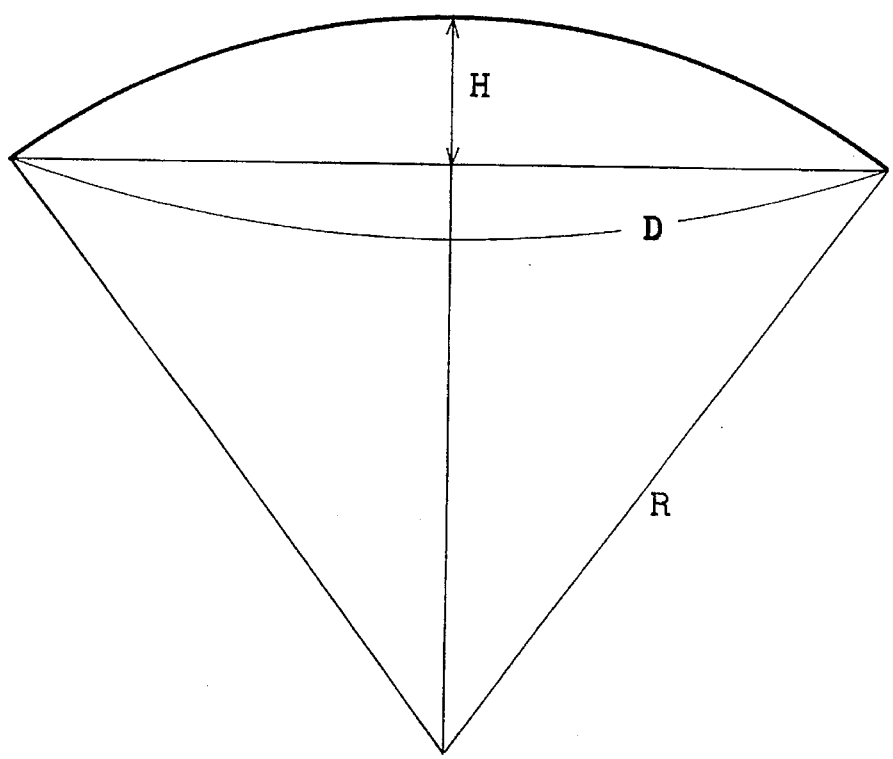
FIG. 10 is an explanatory figure defining the curvature $\xi$, the radius R of curvature and the height H (negative) of bending on a convex film.

When the diamond films had been produced on the square substrates, square grooves of a 23 mm side (☐23 mm) were dug around the peripheries of the diamond films (☐25 mm) on the substrate by scanning a laser beam. Then the silicon substrates were dissolved and eliminated. Free-standing (or self-supporting) diamond films were obtained. The heights H of bending along the orthogonal lines of 30 mm were measured. The signs of the heights H were assigned to be positive (H>0) for concave films (FIG. 9) and to be negative (H<0) for convex films (FIG. 10).

Figure 1:
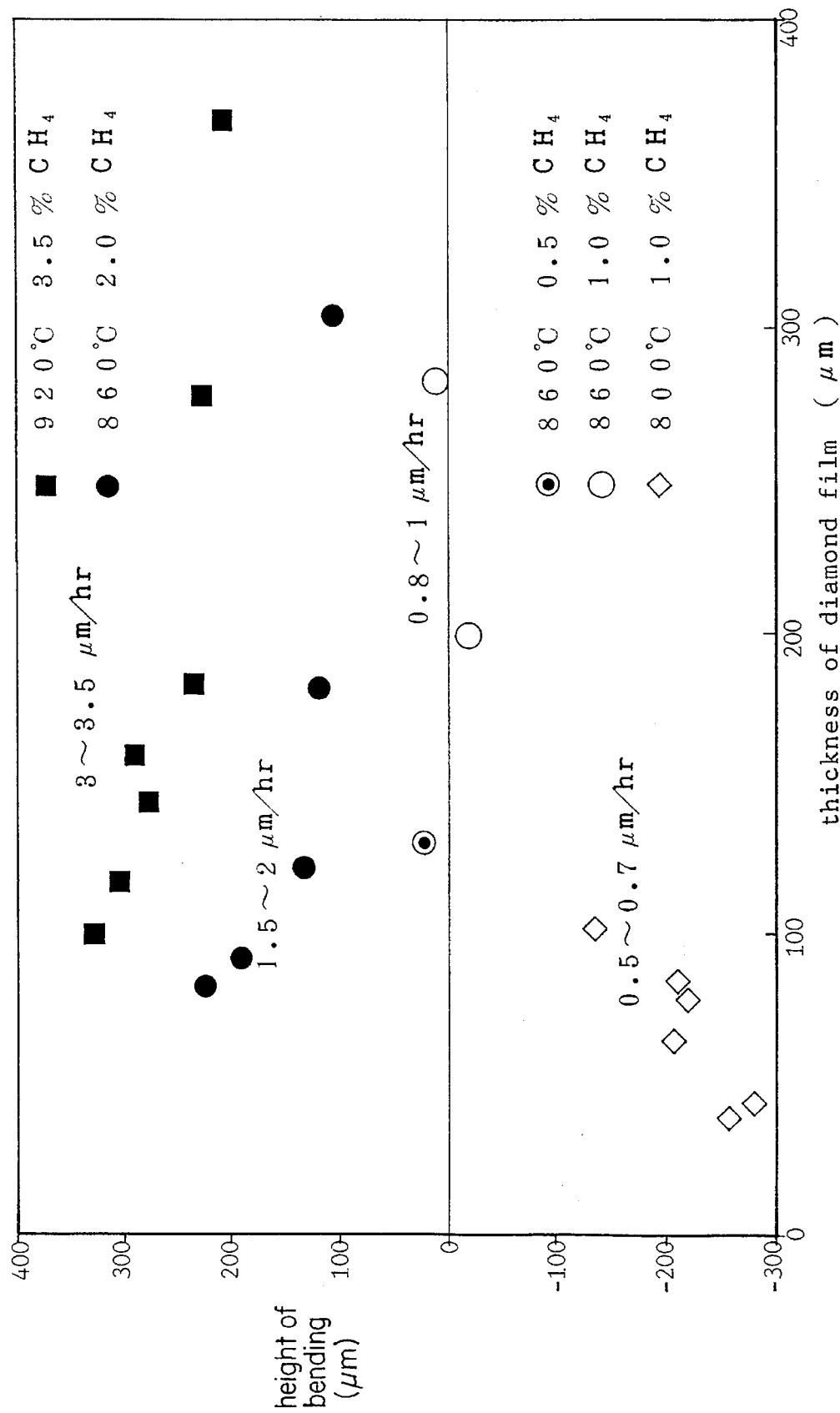
FIG. 1 is a graph showing the result of the measurement of the heights of the deformation of diamond films separated from the substrate, when the diamond films are synthesized under various conditions.

FIG. 1 shows the result of the measurement of the bending quantity (height of the bending H) as a function of the film thickness of diamond with a parameter of the growing speed. The abscissa is the thickness (μmm) of diamond films. The ordinate is the height of bending H. Positive H's mean concave bending. Negative H's denote convex bending. The growing speeds are written in the vicinity of the data points as another result, which is not a controllable parameter but one of the results.

Black square points (■) designate the data for the diamond films which were grown under the condition of a substrate temperature of 920° C. and a methane concentration of 3.5 vol %. The films of black points were piled at a speed of about 3 µm/hr to 3.5 µm/hr, which were quite high speeds.

Black round points (●) denote the results of the films grown by the condition of a substrate temperature of 860° C. and a methane concentration of 2.0 vol %. The films of black rounds were deposited at a speed between 1.5 µm/hr and 2 µm/hr, which were considerably high speeds.

A dotted round (⊙) means the datum of the condition of a substrate temperature of 860° C. and a methane concentration of 0.5 vol %. Blank rounds (○) are the data for a substrate temperature of 860° C. and a methane concentration of 1.0 vol %. They grew at a speed of 0.8/hr to 1/hr, which were low speeds.

Blank lozenge points (◊) signify the results of the condition of a substrate temperature or 800° C. and a methane concentration of 1.0 vol. The speed of deposition was 0.5/hr to 0.7/hr, which were very low speeds. The middle horizontal line means the zero-bending of films. The points above the zero-bending line correspond to concave films (H>0, FIG. 9). The points below the line indicate convex films (H<0, FIG. 10).

The diamond films (■) which were deposited on the Si substrate under the conventional condition of a 920° C. substrate and a 3.5 vol % of methane became a concave free-standing film, when the substrate had been dissolved. This fact harmonizes with the description of prior art (EP-0 551 730 A1). The bending quantity H is the height of the center from the periphery along orthogonal lines of 30 mm. Seven specimens have different thicknesses ranging from 100 µm to 360 µm, which depend on the time of synthesis. The heights of bending are narrowly distributed between +200 µm and +320µm. For example, the height of +300 µm is equivalent to the curvature radius R=37 cm, which is quite large deformation. The speed of synthesis was 3 µm/hr to 3.5 µm/hr, which is a satisfactory high speed. Under the same condition of synthesis, the increase of the thickness tends to suppress the height H of bending. The quality or the diamond films was estimated by the Raman spectroscopic analysis which had been frequently employed for estimating diamond crystals or investigating diamond components in materials. The Raman spectrum indicated that the ratio (a-C/diamond) of the amorphous carbon peak height to the diamond peak height was 0.1 to 0.2, which means that a little amount of amorphous carbon was included in the specimens (■).

The films (●) which had been grown at a lower substrate temperature (860° C.) with a lower methane concentration (2 vol %) than the prior specimens (■) became also concave films. The heights (H) of bending ranges from +100 µm to +220 µm. These results indicate that the lower substrate temperature and the lower hydrocarbon concentration would decrease the bending of free-standing diamond films further more. The velocity of deposition was 1.5 µm/hr to 2 µm/hr. Such low velocities of growth resulted from the low substrate temperature and the low hydrocarbon concentration.

Unexpectedly, the films (◊) which had been produced at a still lower substrate (800° C.) with further lower methane concentration (1.0 vol %) turned out to become convex, when the substrate had been dissolved. The bending quantities H were distributed from −290 µm to −140 µm. The bending heights of the new specimens (◊) were enough equal to the bend of the prior films (■) in absolute value.

These results indicated that diamond films would be deformed into convex shapes, when they were synthesized under some restricted conditions which had not known then. Namely, some condition of synthesis makes convex diamond films. This discovery was quite important. The results were truly surprising, because the skilled persons had believed that the CVD grown diamond films would be deformed into concave shapes because of the tensile stress generated from the difference of thermal expansion coefficients. The quality of the convex, free-standing films (◊) was estimated by the Raman spectroscopic analysis. The ratio (a-C/dia) of amorphous carbon to diamond was less than 0.05. The films were testified to be a high quality diamond. The condition enabled the CVD method to make high quality, convex diamond films. Nevertheless, the condition has a drawback of quite slow deposition speed ranging from 0.5 µm/hr to 0.7 µm/hr.

Then intermediate conditions between the positive height specimens (■) and the negative height specimens (◊) must produce flat diamond films. Therefore, diamond films were further synthesized under an intermediate condition (dotted round ⊙) of a substrate temperature of 860° C. and a methane concentration of 0.5 vol %. The height of bending was about 10 µm, which was a very small distortion. However, the speed of synthesis was 0.8 µm/hr to 1 µm/hr, which were too slow.

Diamond films (○) were produced by another intermediate condition of a substrate temperature of 860° C. and a methane concentration of 1.0 vol %. A film of a 290 µm thickness presented a small height +5 µm of bending. Another film of a 200 µm thickness indicated a −8 µm bending height. The Raman spectrum showed the ratio (a-C/dia) of amorphous carbon to diamond was 0.05, which was sufficiently good quality.

The results of the experiments suggested that there is a possibility of making a non-concave and non-convex film even with a single layer (shown by blank rounds ○ or dotted round ⊙ near the middle line in FIG. 1). This fact was a big discovery itself. However, this invention aims at producing a flat diamond film by coupling potential-convex layers and potential-concave layers. In the film, the tendency of bending concavely cancels the counterpart tendency and the cancellation keeps the multilayered film flat.

Figure 2:
FIG. 2 is a sectional view of a flat substrate at a beginning step.
Figure 3:
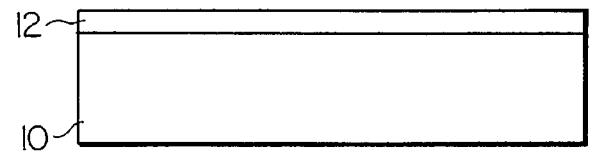
FIG. 3 is a sectional view of the substrate and a potential-convex film deposited on the substrate at the next step.
Figure 4:
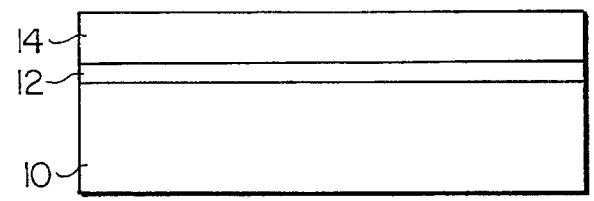
FIG. 4 is a sectional view of the substrate, the potential-convex film on the substrate and a potential-concave film grown on the potential-convex film at a third step.
Figure 5:
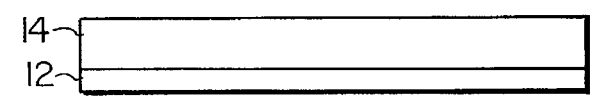
FIG. 5 is a sectional view of a free-standing film having the potential-concave film and the potential-convex film, after the substrate has been removed away.

The method of producing the multilayered film of this invention is now explained by FIG. 2 to FIG. 5. FIG. 2 shows a substrate whose top surface has been scratched by polishing powder, for example, by diamond powder. The scratched surface facilitates the generation of nuclei of diamond. Preferably a potential-convex layer should be grown on the substrate at first, as shown in FIG. 3. The potential-convex layer which yields compressive stress is made by the condition (a) of a lower substrate temperature and a lower methane concentration. Although the speed of growth is slow, the quality is excellent as a diamond film. Since it takes a longer time to grow a potential-convex layer, a thin layer should be grown for curtailing the total time of production. Instead, the potential Q for convex bending per unit thickness should be reinforced by adjusting the condition of growth. Then a potential-concave layer is deposited on the first layer by the condition (b) of a higher substrate temperature and a higher methane concentration, as shown in FIG. 4. Since the condition (b) enables the high speed growth, a thick potential-concave film should be deposited for producing a thick free-standing diamond film (S>T). But the potential U for concave bending per unit thickness must be small enough for balancing the tendency QT to convex bending with the tendency US to concave bending (US≈QT). Finally, the substrate is eliminated by dissolving it by an acid or other solvent. FIG. 5 shows the sectional view of the final free-standing film consisting of the potential-convex layer and the potential-concave layer. Since the tendencies to the concave bending and to the convex bending cancel with each other, the double-layered diamond film is flat (H≈0).

Thus, the present invention Features alternate depositions of potential-convex layers and potential-concave layers. The first layer of deposition can be either a potential-concave layer or a potential-convex layer. It is preferable to deposit a potential-convex layer at first, as shown in FIG. 3. Although potential-convex layers are inferior in the deposition velocity, their crystallographical quality is far better than that of potential-concave layers. If a potential-convex layer is first deposited on a non-diamond substrate, the layer can become a more excellent foundation with a regular interface between the layer and the substrate than a potential-concave layer. When a potential-concave layer s grown on the foundation, the crystallographical order can be maintained to a several μm depth of the potential-concave layer because of the good quality of the foundation. This is the reason why a potential-convex layer is more suitable for the first coat than a potential-concave layer.

Figure 6:
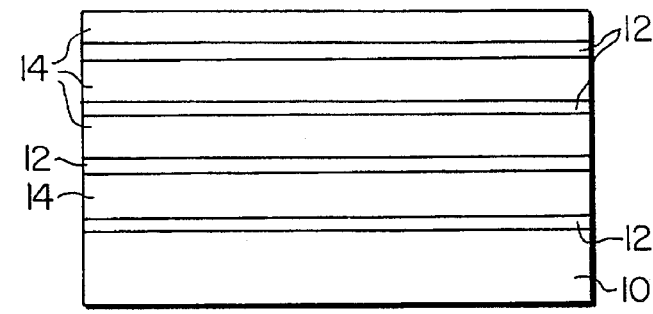
FIG. 6 is a sectional view of a multilayered film having a several pairs of potential-concave layers and potential-convex layers alternately grown on a flat substrate.
Figure 7:
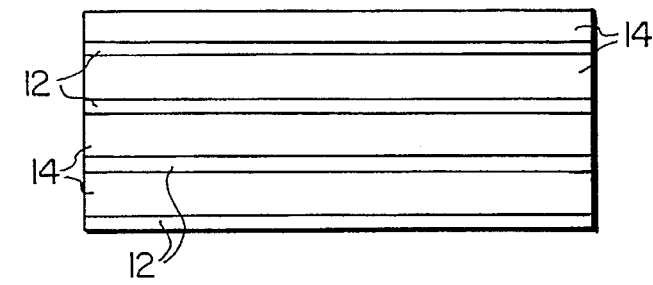
FIG. 7 is a sectional view of a multilayered film having a several pairs of potential-concave layers and potential-convex layers without the substrate.

This invention is not restricted to a single pair of a potential-convex layer and a potential-concave layer. A flat self-supporting (free-standing) film can be produced with two pairs, three pairs or so forth. FIG. 6 shows an example having four pairs of a potential-convex layer and a potential-concave layer which have been deposit in turn on the flat non-diamond substrate. The example employs thinner potential-convex films and thicker potential-concave layers for curtailing the total time of reaction. When a considerably thick free-standing film is required, the request shall be satisfied by piling alternately still more alternate layers. When the diamond potential-concave layer, is to thick the crystallographical property degrades rapidly due to the quick deposition. Thus, it is desirable to stop the growth of the potential-concave layer at a certain thickness and to grow a potential-convex layer which has a strong effect of restoring the crystallographical property due to the slow growth. Therefore, this invention succeeds in making a flat diamond free-standing film with high quality and an arbitrary thickness by the repetitions of the growths of potential-concave layers and potential-convex layers.

Free-standing diamond films were produced by the filament CVD method according to the present invention. Filaments were twelve tantalum wires of 0.5 mm ø which were stretched in a parallel arrangement above a substrate in the horizontal direction. The spacing between the filaments and the substrate was 7 mm. The substrate was a thick, round silicon plate of 50 mm ø×5 mmt. The silicon substrate was mirror-polished and was scratched with diamond powder of average diameter of 0.5 μm to 3 μm. The substrate was mounted on a susceptor having a cooling device in a CVD reaction chamber. The chamber was closed and was made vacuous by a vacuum pump. The filament was heated up to 2280° C. by supplying electric current. The temperature of the filament was maintained at the constant value. The substrate temperature was changed by controlling the cooling device of the susceptor. The pressure in the CVD chamber was kept at 120 Torr (16000Pa). The material gas was a mixture of hydrogen gas and methane gas.

As explained before, the convex-distortion condition (a) is the substrate temperature ranging from 800 to 850 and the methane ratio between 0.5 vol % and 1 vol %. Here the convex-distortion condition (a) included a substrate temperature of 800° C., a methane ratio of 1.0 vol %, and a total gas flux of 1000 sccm (standard cubic centimeter). Under the condition (a), the speed of growth was 1 μm/hr.

On the contrary, the concave-distortion condition (b) is the substrate temperature of 880° C. to 950° C. and methane ratio of 2.5 vol % to 3.5 vol %. Here the concave-distortion condition (b) is also characterized by a substrate temperature of 900° C. and a methane ratio of 3.5 vol % and a total gas flux of 1000 sccm. Under the condition (b), the speed of growth was 4 μm/hr.

Various diamond films whose total thicknesses were 400 μm were synthesized on the silicon substrates by mixing the concave-distortion condition (b) with the convex-distortion condition (a). Single-layered films were also produced for the purpose of comparison. The thicknesses of individual layers were controlled by the time of deposition. After the diamond film of 400 u m had been grown on the round substrate of 50 mm ø, a circular groove of 48 mm ø was formed around the periphery of the diamond film with the substrate by a laser beam. Then the substrates were dissolved away in a mixture of fluoric acid and nitric acid. Diamond films of 48 mm ø were finally obtained as free-standing films.

Figure 8:
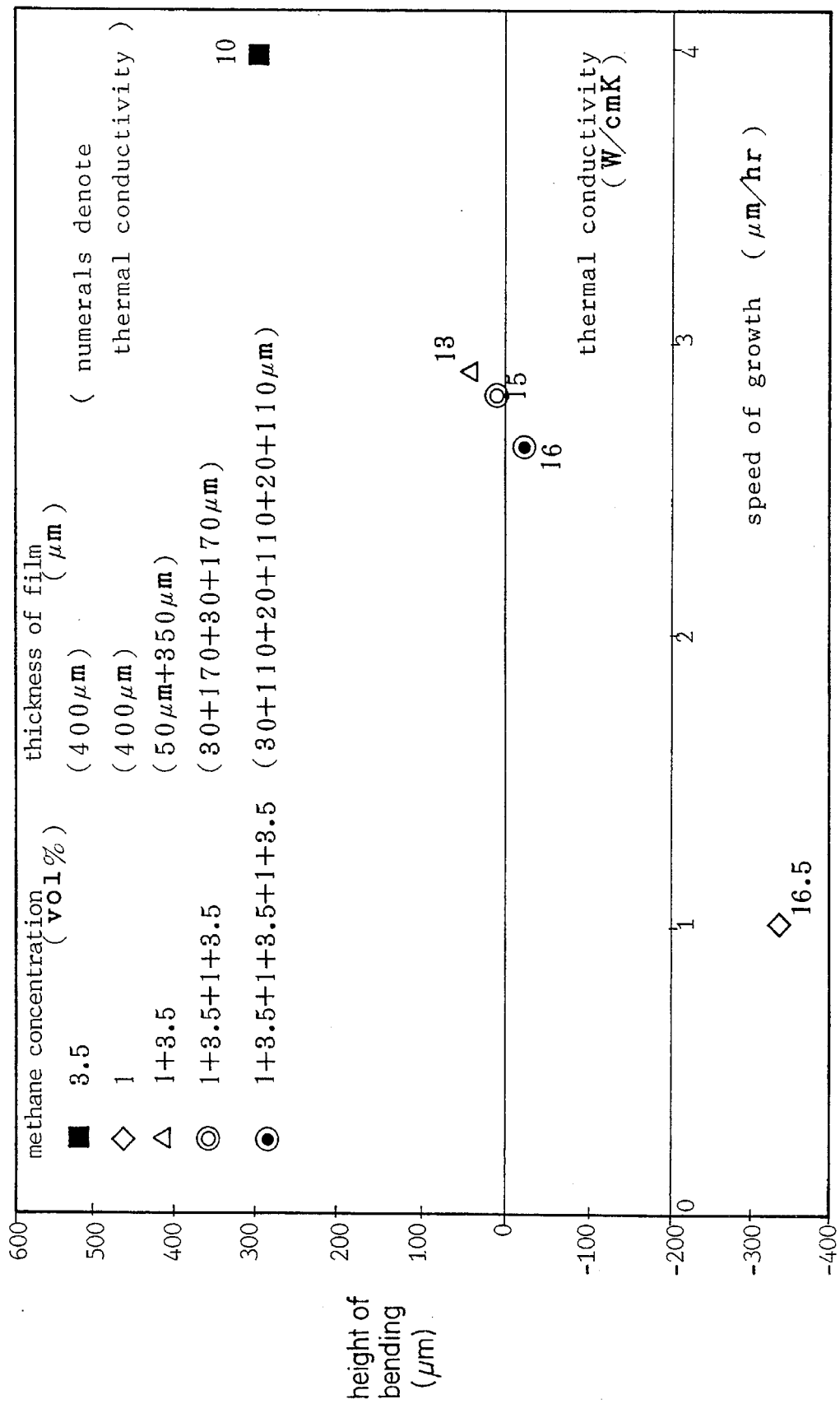
FIG. 8 is a graph showing the growth speed, thermal conductivity and the height of bending for various embodiments having more than one pair of a potential-convex layer and a potential-concave layer.

The bending height H was measured for a partial diameter 40 mm (D=40 mm) in the total 48 mm diameter. Square samples of □ 10 mm were cut from the round diamond films by a laser beam. The samples were polished on both surfaces. The heat conductivities were measured for the diamond square samples. The heat conductivities turned out to vary according to the compounds. High heat conductivity is extremely important for the diamond of heat sinks or substrates of semiconductor devices. This invention is further superior in providing highly heat conductive diamond. FIG. 8 shows the results of measurements which contain the cases of two single-layered films and three multilayered films. The abscissa is the speed of growth (μm/hr). The ordinate denotes the height H of bending (μm). Blank lozenge (◇) denoted convex single layered diamond films of a 400 μmm thickness. Black square (■) designates concave single-layered films of 400 μm thickness. Blank triangle (△) means double-layered diamond films. Double round (◎) shows four-layered diamond films. Dotted round (⊙) denotes six-layered films. Numerals accompanying the data points are heat (thermal) conductivity (W/cmK) of the sample. All the samples will be explained now.

[Single Layered film 1 (◇)]

Single layered diamond films of a 400 μm thickness were grown by the convex-bending condition (a) (methane ratio of 1 vol % and substrate temperature of 800° C. ) on the silicon substrates. When the substrates were eliminated, the films were deformed into convex shape whose height H of bending was −350 μm (R=−57 cm). The sample revealed a high heat conductivity of 16.5 W/cmK. The speed of synthesis was 1 μm/hr, which was very slow.

[Single Layered film 2 (■)]

Another single layered diamond films of 400 μm thickness were grown by the concave-bending condition (b) (methane ratio of 3.5 vol % and substrate temperature of 900° C.). The films were deformed into concave shape whose height H of bending was +260 μm (R=+77 cm). The samples revealed a low heat conductivity of 10 W/cmK. The low heat conductivity resulted from the bad quality of the diamond films which contained amorphous-carbon, etc. The speed of synthesis was 4 μm/hr, which was very fast.

[Embodiment ①: multilayered films 1 (△)]

A layer of a 50 μm thickness was grown by the convex-bending condition (a) (methane ratio of 1 vol % and substrate temperature of 800° C.) at first on the silicon substrate. Then another layer of a 350 μm thickness was deposited on the layer by the concave-bending condition (b) (methane ratio of 3.5 vol % and substrate temperature of 900° C.). When the silicon substrates were dissolved, the double-layered films were deformed into a convex shape. The height H of bending was +35 μm (R=+500 cm). The average speed of growth was 2.9 μm/hr. The heat conductivity was 13 W/cmK, which was higher than the single layered samples (■) of concave-bending. The improvement resulted from the enhancement of crystal property due to the potential-convex layer which had intrinsically good crystal property. These samples were double layered-films consisting of a potential-convex layer and a potential-concave layer. The tendencies for concave-bending and for convex-bending nearly cancelled each other out. Thus, the double-layered films had satisfactory flatness.

[Embodiment ②: multilayered films 2(◎)]

A layer of a 30 μm thickness was grown by the convex-bending condition (a) (methane ratio of 1 vol % and substrate temperature of 800° C.) at first on the silicon substrate. Then a second layer of a 170 μm thickness was deposited on the first layer by the concave-bending condition (b) (methane ratio of 3.5 vol % and substrate temperature of 900° C.). Further, a third layer was grown on the second layer by the condition (a) to a thickness of 30 μm. Finally, a fourth layer was deposited on the third layer by the condition (b) to a thickness of 170 μm. The thicknesses (30+170+30+170 μm) of all layers are designated in FIG. 8. The changes (1+3.5+1+3.5 vol %) of methane ratio are also indicated in FIG. 8. When the silicon substrates were dissolved, the four-layered films were deformed into a concave shape. The height H of bending was +10 μm. The average speed of growth was 2.8 μm/hr. The heat conductivity was 15 W/cmK, which was higher than the double-layered samples (Δ). Total thickness of the potential-convex layers was 60 μm. Since the ratio of the potential-convex layer was slightly higher than the multilayered films 1 (Δ), the bending H was lower than the multi layered films 1 (Δ).

[Embodiment ③: multilayered films 3 (○)]

At first, a diamond layer was produced on the substrate under the convex-bending condition (a) (methane 1 vol %, substrate temperature 800° C.) to a thickness of 30 μm. Secondly, a potential-concave film of a 110 μm thickness was deposited under the concave-bending condition (b) (methane 3.5 vol %, substrate temperature 900° C.). Thirdly, a 20 μm thick layer was grown under the condition (a). Fourthly, a 110 μm thick film was synthesized by the condition (b). Further, a 20 μm thick potential-convex film and a 110 μm thick potential-concave film were grown respectively by the conditions (a) and (b). The six-layered films had a small height of bending of −15 μm and a high heat conductivity of 16 W/cmK. The average velocity of growth was 2.7 μm/hr. The samples were six-layered. The total thickness of the potential-convex layers was 70 μm, which was 10 μm bigger than the former multilayered samples 2(◎).

The concave-potential U per unit thickness and the convex-potential Q per unit thickness can be calculated from the three embodiments. Embodiment ① gives S=350 μm, T=50 μm and H=+35 μm. Embodiment ② gives s=340 μm, T=60 μm and H=+10 μm.

Embodiment ③ indicates S=330 μm, T=70 μm and H=−15 μm.

The above values establish equations 350U+50Q=+35, 340U+60Q=+10 and 330U+70Q=−15, which give a solution of U=+0.4 and Q=−2.1. Namely, the diamond layer synthe- sized by the condition (b) has a concave-bending potential of +0.4 per unit thickness, and the diamond layer made by the condition (a) has a convex-bending potential of −2.1 per unit thickness. These values of potentials enable the height of bending of an arbitrary diamond film consisting of the layers produced by either condition (a) or condition (b) to be anticipate. For example, a perfectly flat film (H=0) would be made by the selection of H=336 μm and T=64 μm. The values of potentials U and Q have a significance only for the multilayered film consisting of more than one pair of a potential-convex layer and a potential-concave layer. The potentials have no exact meaning for single-layered films. Indeed the single layered film (■) has a bending height of +260 μm which is different from the calculated value 400U= 400×0.4=160. The other single layered film (Δ) has a bending height of −360 μm which differs from the calculated value 400Q=400×(−2.1)=−840 μm.

What we claim is:

1. A method of synthesizing a free-standing diamond film comprising the steps off:

growing at least one potential-convex diamond layer on a substrate by a CVD method using hydrogen gas and hydrocarbon gas under a condition (a) such that the at least one potential-convex diamond layer has a potential to deform into a convex shape by elimination of the substrate;

growing at least one potential-concave diamond layer on the potential-convex diamond layer by a CVD method under a condition (b) such that the at least one potential-concave diamond layer has a potential to deform into a concave shape by elimination the substrate;

alternating said growing steps such that the potential-convex and potential-concave diamond layers alternate;

eliminating the substrate; and obtaining the free-standing diamond film having at least one potential-convex layer and at least one potential-concave layer, the potential-convex and potential concave layers being deposited alternately.

2. A method as claimed in claim 1, wherein the condition (a) is defined by a substrate temperature between 800° C. and 850° C., and a volume ratio of hydrocarbon to total gas ranging from 0.5 vol % to 1.5 vol %.

3. A method as claimed in claim 2, wherein the condition (b) is defined by a substrate temperature between 880° C. and 950° C., and a volume ratio of hydrocarbon to total gas ranging from 2.5 vol % to 3.5 vol %.

4. A method as claimed in claim 3, wherein the diamond layers are synthesized by a filament CVD method with a filament temperature of higher than 2100° C., a distance between filaments and the substrate of 5 mm to 10 mm, and a reaction pressure of 50 Torr to 150 Torr.

5. A method as claimed in claim 1, wherein a total convex-bending potential of the at least one potential-convex layer balances with a total concave-bending potential of the at least one potential-concave layer, such that the free-standing diamond film is flat.

6. A method as claimed in claim 5, wherein the at least one potential-convex diamond layer includes a j-th potential-concave layer having a thickness $S_j$ and a concave-bending potential $U_j$ per unit thickness, wherein the at least one potential-convex diamond layer includes a K-th potential-convex layer having a thickness $T_k$ and a convex-bending potential $Q_k$ per unit thickness, and wherein the total convex-bending potential $\Sigma Q_k T_k$ of the at least one potential-convex layer balances with the total concave-bending potential ρ $U_jS_j$ of the at least one potential-concave layer, such that the free-standing diamond film is flat.

7. A method as claimed in claim 6, wherein a convex-bending potential Q per unit thickness is greater than a concave-bending potential U per unit thickness and the at least one potential-convex layer has a total thickness T that is smaller than a total thickness S of the at least one potential-concave layer.

8. A method of synthesizing a free-standing diamond film comprising the steps of:

growing at least one potential-concave diamond layer on a substrate by a CVD method using hydrogen gas and hydrocarbon gas under a condition (b) such that the at least one potential-concave diamond layer has the potential to deform into a concave shape by elimination of the substrate;

growing at least one potential-convex diamond layer on the potential-concave diamond layer by a CVD method under a condition (a) such that the at least one potential-convex diamond layer has the potential to deform into a convex shape by elimination of the substrate;

alternating said growing steps such that the potential-concave and potential-convex diamond layers alternate;

eliminating the substrate; and obtaining the free-standing diamond film having at least one potential-convex layer and at least one potential-concave layer, the potential-convex and potential-concave layers being deposited alternately.

9. A method as claimed in claim 8, wherein the condition (a) is defined by a substrate temperature between 800° C. and 850° C., and a volume ratio of hydrocarbon to total gas ranging from 0.5 vol % to 1.5 vol %.

10. A method as claimed in claim 9, wherein the condition (b) is defined by a substrate temperature between 880° C. and 950° C., and a volume ratio of hydrocarbon to total gas ranging from 2.5 vol % to 3.5 vol %.

11. A method as claimed in claim 10, wherein the diamond layers are synthesized by a filament CVD method with a filament temperature of higher than 2100° C., a distance between filaments and the substrate of 5 mm to 10 mm, and a reaction pressure of 50 Torr to 150 Torr.

12. A method as claimed in claim 8, wherein a total convex-bending potential of the at least one potential-convex layer balances with a total concave-bending potential of the at least one potential-concave layer, such that the free-standing diamond film is flat.

13. A method as claimed in claim 12, wherein the at least one potential-convex diamond layer includes a j-th potential-concave layer having a thickness $S_j$ and a concave-bending potential $U_j$ per unit thickness, wherein the at least one potential-convex diamond layer includes a K-th potential-convex layer having a thickness $T_k$ and a convex-bending potential $Q_k$ per unit thickness, and wherein the total convex-bending potential $\Sigma\ Q_kT_k$ of the at least one potential-convex layer balances with the total concave-bending potential $\Sigma\ U_jS_j$ of the at least one potential-concave layer, such that the free-standing diamond film is flat.

14. A method as claimed in claim 13, wherein a convex-bending potential Q per unit thickness is greater than a concave-bending potential U per unit thickness and the at least one potential-convex layer has a total thickness T that is smaller than a total thickness S of the at least one potential-concave layer.

15. A free-standing diamond film comprising at least one potential-convex layer which has a potential for bending into a convex shape and at least one potential-concave layer which has a potential for bending into a concave shape, the potential-convex and potential concave layers being deposited alternately.

16. A free-standing diamond film as claimed in claim 15, wherein a total convex-bending potential of the at least one potential-convex layer balances with a total concave-bending potential of the at least one potential-concave layer, such that the free-standing diamond film is flat.

17. A free-standing diamond film as claimed in claim 16, wherein the at least one potential-convex diamond layer includes a j-th potential-concave layer having a thickness $S_j$ and a concave-bending potential $U_j$ per unit thickness, wherein the at least one potential-convex diamond layer includes a K-th potential-convex layer having a thickness $T_k$ and a convex-bending potential $Q_k$ per unit thickness, and wherein the total convex-bending potential $\Sigma\ Q_kT_k$ of the at least one potential-convex layer balances with the total concave-bending potential $\Sigma\ U_jS_j$ of the at least one potential-concave layer, such that the free-standing diamond film is flat.

18. A free-standing diamond film as claimed in claim 17, wherein a convex-bending potential Q per unit thickness is greater than a concave-bending potential U per unit thickness and the at least one potential-convex layer has a total thickness T that is smaller than a total thickness S of the at least one potential-concave layer.

19. A free-standing diamond film as claimed in claim 18, wherein the heat conductivity is more than 12 W/cmK.

20. A polishing method of polishing a free-standing diamond film on a substrate comprising the steps of:

growing at least one potential-convex diamond layer on a flat substrate by a CVD method under a condition (a) such that the at least one potential-convex diamond layer has a potential to deform into a convex shape by elimination of the substrate;

growing at least one potential-concave diamond layer on the potential-convex diamond layer by a CVD method under a condition (b) such that the at least one potential-concave diamond layer has a potential to deform into a concave shape by elimination the substrate;

alternating said growing steps such that the potential-convex and potential-concave diamond layers alternate;

polishing at least one of the diamond layers still fixed on the flat substrate;

eliminating the substrate; and obtaining the polished free-standing diamond film having at least one potential-convex layer and at least one potential-concave layer, the potential-convex and potential concave layers being deposited alternately.

21. A polishing method as claimed in claim 20, wherein the condition (a) is defined by a substrate temperature between 800° C. and 850° C., and a volume ratio of hydrocarbon to total gas ranging from 0.5 vol % to 1.5 vol %.

22. A polishing method as claimed in claim 21, wherein the condition (b) is defined by a substrate temperature between 880° C. and 950° C., and a volume ratio of hydrocarbon to total gas ranging from 2.5 vol % to 3.5 vol %.

23. A polishing method as claimed in claim 22, wherein the diamond layers are synthesized by a filament CVD method with a filament temperature of higher than 2100° C., a distance between filaments and the substrate of 5 mm to 10 mm, and a reaction pressure of 50 Torr to 150 Torr.

24. A polishing method as claimed in claim 20, wherein a total convex-bending potential of the at least one potential-convex layer balances with a total concave-bending potential of the at least one potential-concave layer, such that the free-standing diamond film is flat.

25. A polishing method as claimed in claim 24, wherein the at least one potential-convex diamond layer includes a j-th potential-concave layer having a thickness $S_j$ and a concave-bending potential $U_j$ per unit thickness, wherein the at least one potential-convex diamond layer includes a K-th potential-convex layer having a thickness $T_k$ and a convex-bending potential $Q_k$ per unit thickness, and wherein the total convex-bending potential $\Sigma\ Q_k T_k$ of the at least one potential-convex layer balances with the total concave-bending potential $\Sigma\ U_j S_j$ of the at least one potential-concave layer, such that the free-standing diamond film is flat.

26. A polishing method as claimed in claim 25, wherein a convex-bending potential Q per unit thickness is greater than a concave-bending potential U per unit thickness and the at least one potential-convex layer has a total thickness T that is smaller than a total thickness S of the at least one potential-concave layer.

27. A method as claimed in claim 1, wherein a plurality of potential-convex diamond layers and a plurality of potential-concave diamond layers are grown, the potential-convex layers being arranged alternately with the potential-concave layers.

28. A method as claimed in claim 8, wherein a plurality of potential-convex diamond layers and a plurality of potential-concave diamond layers are grown, the potential-convex layers being arranged alternately with the potential-concave layers.

29. A free-standing diamond film according to claim 15, wherein the film includes a plurality of potential-convex diamond layers and a plurality of potential-concave diamond layers, the potential-convex layers being arranged alternately with the potential-concave layers.

30. A polishing method as claimed in claim 20, wherein a plurality of potential-convex diamond layers and a plurality of potential-concave diamond layers are grown, the potential-convex layers being arranged alternately with the potential-concave layers.

31. A method as claimed in claim 1, wherein the substrate is flat.

32. A method as claimed in claim 8, wherein the substrate is flat.

* * * * *